（12）United States Patent
Shen et al.

(10) Patent No.: US 8,288,750 B2
(45) Date of Patent: Oct. 16, 2012

(54) PHASE CHANGE MEMORY DEVICE WITH AIR GAP

(75) Inventors: Ming-Huei Shen, Dounan Town (TW); Shih-Chang Liu, Alian Township, Kaohsiung County (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 219 days.

(21) Appl. No.: 12/770,344

(22) Filed: Apr. 29, 2010

(65) Prior Publication Data

US 2011/0266511 A1 Nov. 3, 2011

(51) Int. Cl.
*H01L 29/04* (2006.01)
*H01L 47/00* (2006.01)

(52) U.S. Cl. . 257/3; 438/102; 257/E21.09; 257/E45.002

(58) Field of Classification Search .................. 257/2–5, 257/522, E45.002; 438/385, 411, 412, 619, 438/102
See application file for complete search history.

(56) References Cited

U.S. PATENT DOCUMENTS

| | | | | |
|---|---|---|---|---|
| 6,670,628 B2 * | 12/2003 | Lee et al. | | 257/4 |
| 7,808,071 B2 * | 10/2010 | Hu et al. | | 257/500 |
| 2008/0265238 A1 * | 10/2008 | Chen et al. | | 257/3 |
| 2010/0177553 A1 * | 7/2010 | Lee et al. | | 365/148 |
| 2011/0057161 A1 * | 3/2011 | Sandhu et al. | | 257/2 |

* cited by examiner

*Primary Examiner* — Julio J Maldonado
*Assistant Examiner* — Sonya McCall Shepard
(74) *Attorney, Agent, or Firm* — Haynes and Boone, LLP

(57) ABSTRACT

A semiconductor device is provided which includes a bottom electrode contact formed on a substrate, and a dielectric layer formed on the bottom electrode contact. The device further includes a heating element formed in the dielectric layer, wherein the heating element is disposed between two air gaps separating the heating element from the dielectric layer, and a phase change element formed on the heating element, wherein the phase change element includes a substantially amorphous background and an active region, the active region capable of changing phase between amorphous and crystalline. A method of forming such a device is also provided.

20 Claims, 9 Drawing Sheets

PHASE CHANGE MEMORY DEVICE WITH AIR GAP

BACKGROUND

The present disclosure relates generally to semiconductor devices and, more particularly, semiconductor devices having a phase change memory portion.

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. However, the reduction in size of device geometries introduces new challenges that need to be overcome.

Phase change material used in some memory devices ("phase change memory devices"), generally exhibits two phases (also called "states"): amorphous and crystalline. The amorphous state of the phase change material generally exhibits greater resistivity than the crystalline state. The state of the phase change material may be selectively changed by a stimulation, such as an electrical stimulation. Such electrical stimulation may be applied, for example, by supplying an amount of current through an electrode or heating element in contact with the phase change material.

Phase change memory devices are a promising technology for next generation non-volatile memory because of good performance, endurance, and scalability. However, one of the obstacles of phase change memory devices is the energy leakage associated with the heating element, which leads to inefficiencies and degradation of device performance. Therefore, a need exists for a phase change memory device and method of making the same with improved thermal isolation or energy loss prevention.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 2:
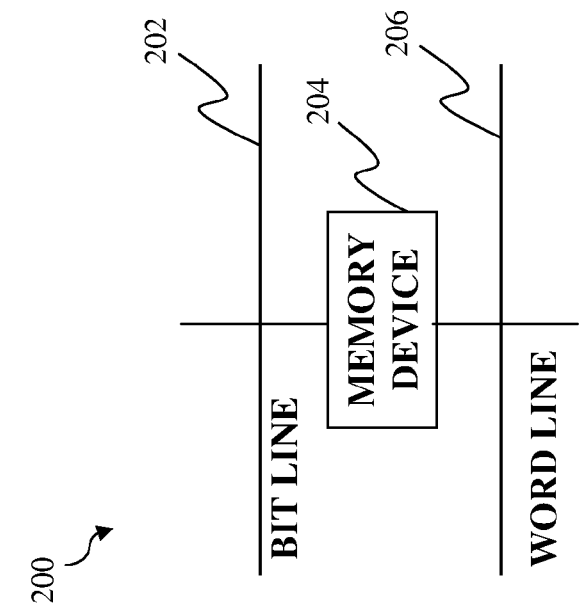
FIG. 2 is a circuit diagram of a memory cell that embodies aspects of the present disclosure.

The present disclosure provides for many different embodiments. One of the broader forms of the present disclosure involves a semiconductor device. The device includes a bottom electrode contact formed on a substrate, and a dielectric layer formed on the bottom electrode contact. The device further includes a heating element formed in the dielectric layer, wherein the heating element is disposed between two air gaps separating the heating element from the dielectric layer, and a phase change element formed on the heating element, wherein the phase change element includes a substantially amorphous background and an active region, the active region capable of changing phase between amorphous and crystalline.

Another of the broader forms of the present disclosure involves another semiconductor device, the device including a substrate, a bottom electrode contact formed on the substrate, a silicon oxide layer formed on the bottom electrode contact, and a silicon nitride layer formed on the silicon oxide layer, and a heating element formed in the silicon oxide layer and the silicon nitride layer. The device further includes two air gaps in silicon oxide, the air gaps separating the heating element from the silicon oxide layer and the silicon nitride layer, wherein each of the two air gaps has a height substantially similar to a height of the heating element, a phase change element formed on the heating element, wherein the phase change element includes a substantially amorphous background and an active region, the active region capable of changing phase between amorphous and crystalline, and a conductive element formed on the phase change element.

Yet another of the broader forms of the present disclosure involves a method of fabricating a semiconductor device. The method includes providing a substrate having a dielectric layer formed thereon, forming a heating element in the dielectric layer, and forming an air gap separating a side of the heating element from the dielectric layer. The method further includes forming a phase change element on the heating element, wherein the phase change element includes a substantially amorphous background and an active region, the active region capable of changing phase between amorphous and crystalline.

DETAILED DESCRIPTION

The present disclosure relates generally to semiconductor devices and more particularly, to a memory device having features in an array and peripheral region and methods for fabricating the same. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail.

Furthermore, reference numbers are repeated throughout the drawings for sake of convenience and example, and such repetition does not indicate any required combination of features or steps throughout the drawings. Moreover, the formation of a first feature over, on, adjacent, abutting, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including for example, etching a substrate, may include embodiments where features are formed above the surface of the substrate, directly on the surface of the substrate, and/or extending below the surface of the substrate (such as, trenches). A substrate may include a semiconductor wafer and one or more layers formed on the wafer.

Figure 1:
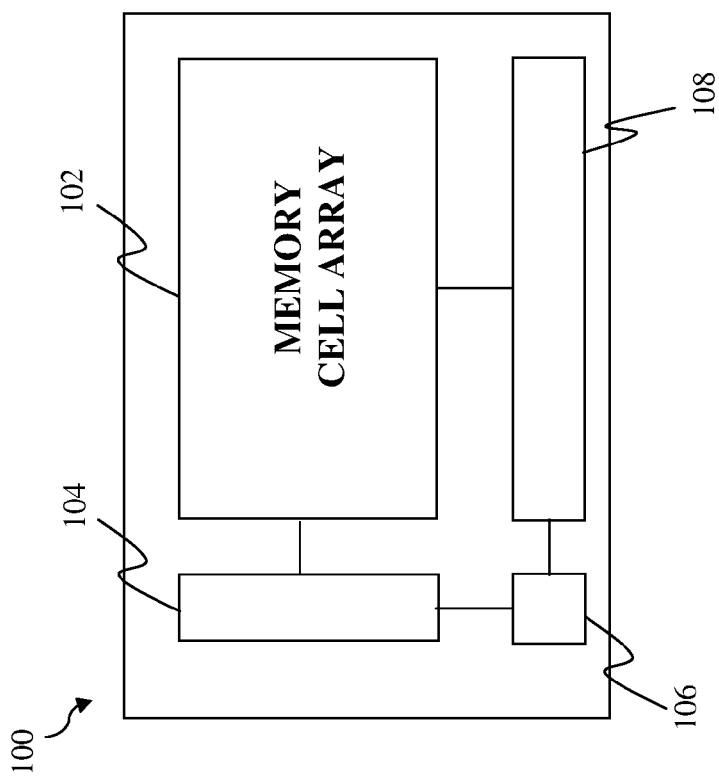
FIG. 1 is a block diagram of an integrated circuit that embodies aspects of the present disclosure.

Referring now to FIG. 1, illustrated is a block diagram of an integrated circuit ("IC"), indicated generally at 100, according to an illustrative embodiment. The IC 100 includes a memory cell array 102, and array logic/interface circuitries 104 and 106. The circuitry 104 includes various logic circuitries such as row/word latches, a decoder and/or a buffer. The circuitry 106 includes other logic circuitries such as column/bit/digit lines, a decoder, amplifiers, and/or a buffer. The IC 100 also includes a control circuitry 108. The circuitry 108 includes, for example, circuitries for input/output ("I/O") timing and refresh control. Moreover, depending on the particular version of the illustrative embodiment, the geometric arrangement of the memory cell array 102 may vary. For example, in one version of the illustrative embodiment, the memory cell array 102 is located partially or substantially over the circuits 104, 106, and 108.

Referring to FIG. 2, illustrated is a circuit diagram of a memory cell, indicated generally at 200, according to the illustrative embodiment. The memory cell 200 includes a memory device 204, at least one word line 206, and at least one bit line 202. The memory cell 200 also includes semiconductor doped regions, conductive material, and/or electrical insulating material. The memory device 204 includes a plurality of semiconductor layers, each for storing at least one logical binary state. For example, in at least one version of the illustrative embodiment, the memory device 204 includes a layer for storing a logical binary state in response to thermal energy. In another version of the illustrative embodiment, the memory device 204 includes a layer for storing logical binary state in response to a magnetic field. In both versions, the response is associated with a detectable change in the electrical and/or crystalline properties of the layer's material, to provide one or more memory functions. For example, the word line 206 includes at least one conductive interconnect proximate the memory device 204 such that the word line 206 provides a current to induce heating in the memory device 204. Similarly, the bit line 202 includes at least one conductive interconnect proximate the memory device 204 for reading information from and/or writing information to the memory device 204.

Figure 3:
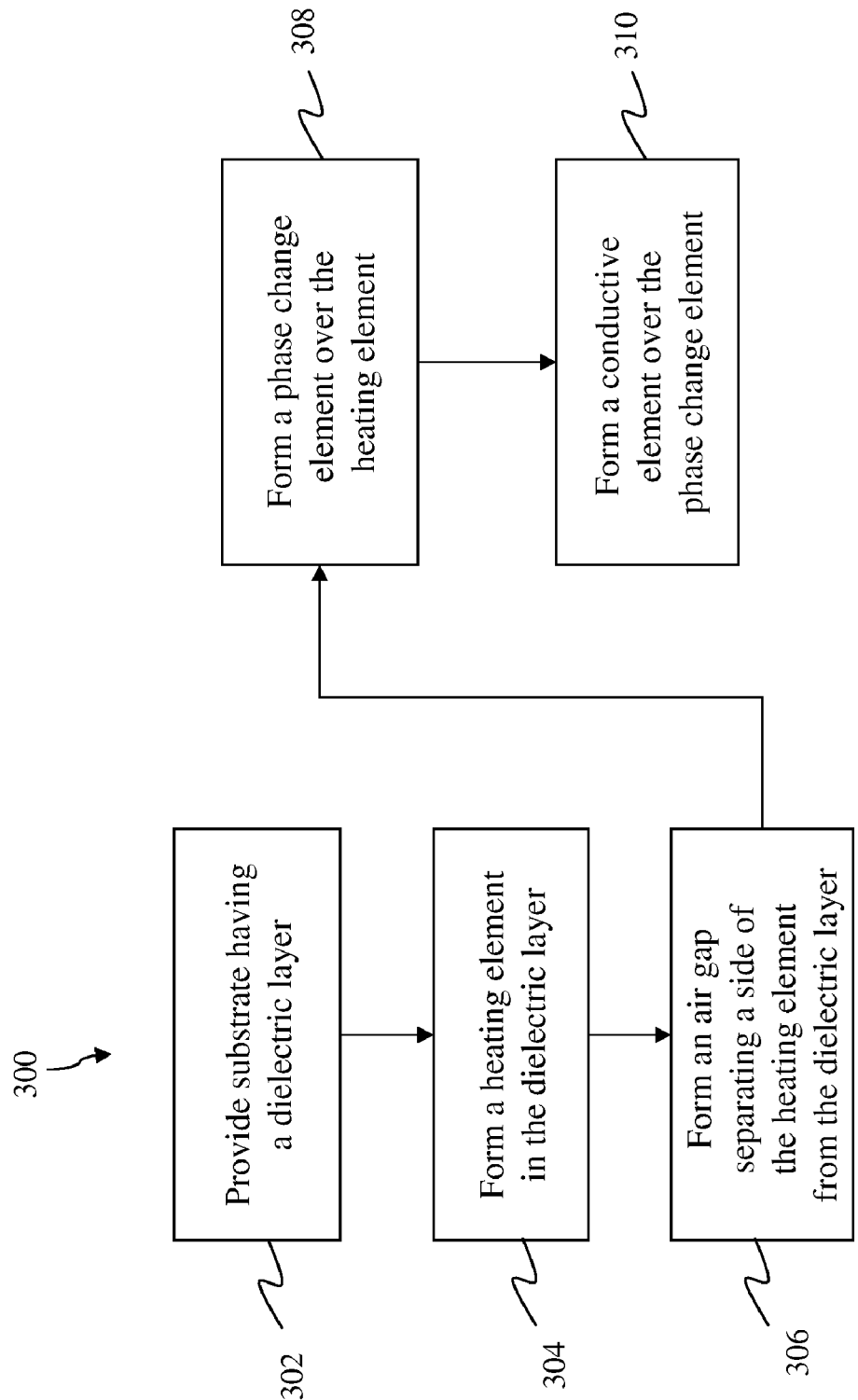
FIG. 3 is a flowchart of a method for fabricating a memory device that may be utilized in the memory cell of FIG. 2.

Referring now to FIG. 3, illustrated is a flowchart of a method 300 for fabricating a memory device 400 according to an illustrative embodiment. Referring also to FIGS. 4A-4L, illustrated are cross-sectional views of the memory device 400 at various stages of fabrication in accordance with the method 300 of FIG. 3. The memory device 400 is representative of the memory device 204 of FIG. 2. It is understood that the memory device 400 illustrated in FIGS. 4A-4L may include various semiconductor layers, such as doped layers, insulative layers, epitaxial layers, conductive layers including polysilicon layers, and dielectric layers, but is simplified to illustrate a phase change portion of the memory device for a better understanding of the disclosed embodiments herein.

Figure 4B:
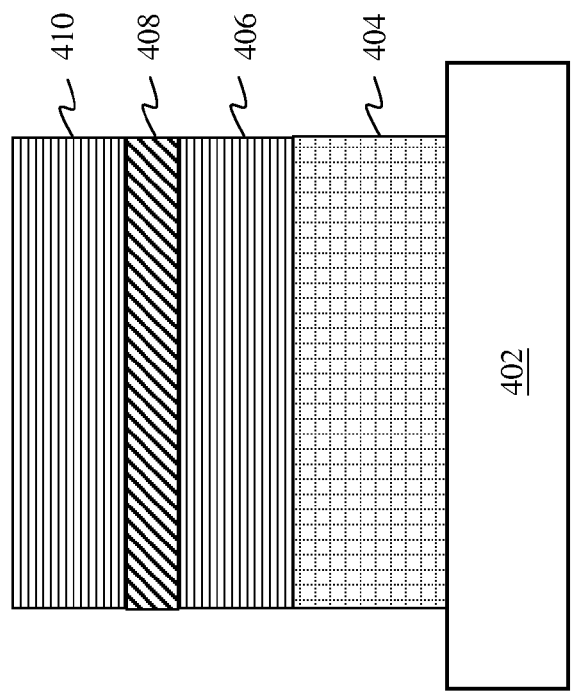
FIGS. 4A-4L are sectional views of the memory device at various stages of fabrication in accordance with the method of FIG. 3.
Figure 4A:
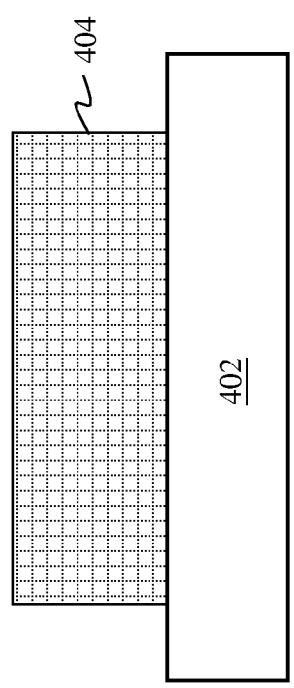

In FIG. 4A, the method 300 begins with block 302 in which a substrate 402, such as a semiconductor wafer, is provided. The substrate 402 includes one or more active devices such as transistors formed therein. The substrate 402 may include silicon in a crystalline structure. In alternative embodiments, the substrate 402 may optionally include other elementary semiconductors such as germanium, or may include a compound semiconductor such as, silicon carbide, gallium arsenide, indium arsenide, or indium phosphide. Additionally, the substrate 402 may include a silicon on insulator (SOI) substrate, a polymer-on-silicon substrate, or the like. The substrate 402 may further comprise one or more layers formed on a substrate. Examples of layers that may be formed include doped layers, insulative layers, epitaxial layers, conductive layers including polysilicon layers, dielectric layers, and/or other suitable semiconductor layers.

The memory device 400 includes a bottom electrode contact ("BEC") 404. In one example, the BEC 404 may include a plug formed by patterning and etching a trench in a silicon oxide layer and filling the trench with a conducting material such as tungsten, and then etched back. The plug may include other conducting materials such as copper, aluminum, tantalum, titanium, nickel, cobalt, metal silicide, metal nitride, and polysilicon. Such a plug BEC is shown for example in FIG. 5.

The method 300 continues with block 304 in which a heating element 419 (FIGS. 4H and 4I) is formed on the BEC 404. In FIG. 4B, a dielectric layer or layers is formed over the BEC 404. In one example, a first silicon oxide ("oxide") layer 406 is formed over the BEC 404, a silicon nitride ("nitride") layer 408 is formed over the oxide layer 406, and then a second silicon oxide ("oxide") layer 410 is formed over the nitride layer 408. The dielectric layers may be deposited by chemical vapor deposition ("CVD"), plasma enhanced CVD ("PECVD"), and/or other suitable methods.

Figure 4D:
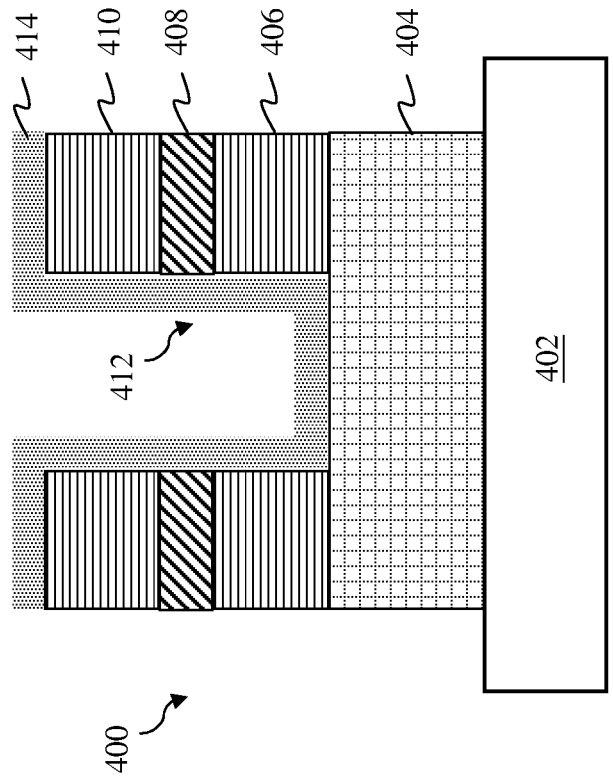
Figure 4C:
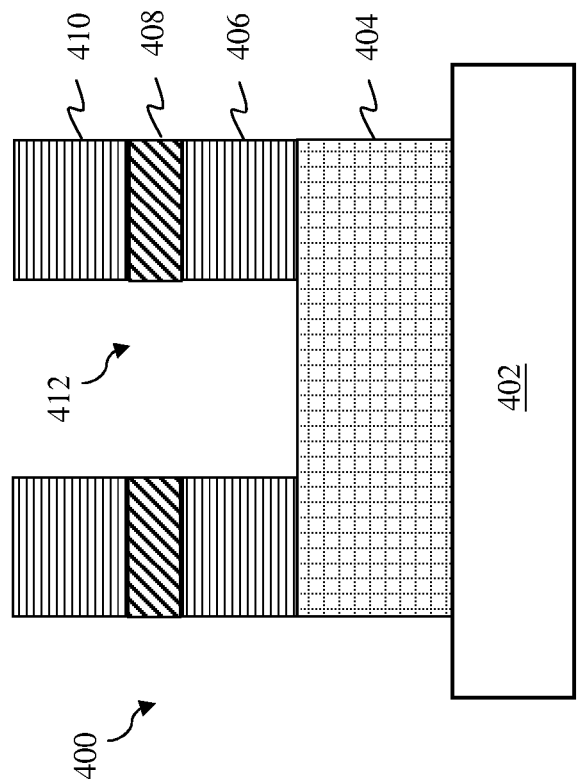

In FIG. 4C, the first oxide layer 406, the nitride layer 408, and the second oxide layer 410 may then be patterned and etched to form a crown feature including a trench 412 within the dielectric layers directly over the BEC 404. Such a patterning process may include wet and/or dry etching employing a mask, masking process, and/or photolithographic processes.

In FIG. 4D, an ashing removable dielectric (ARD) layer 414 (e.g., a type of photoresist material) is formed over BEC 404 and the crown feature including oxide layer 410, to fill the trench 412 over BEC 404. ARD layer 414 may be formed by various deposition techniques such as spin on coating, CVD, PECVD, and/or other suitable techniques. ARD layer 414 is later processed to create a spacer for subsequent deposition of a heating layer (e.g., a TiN layer) as shown in FIGS. 4E and 4F.

Figure 4F:
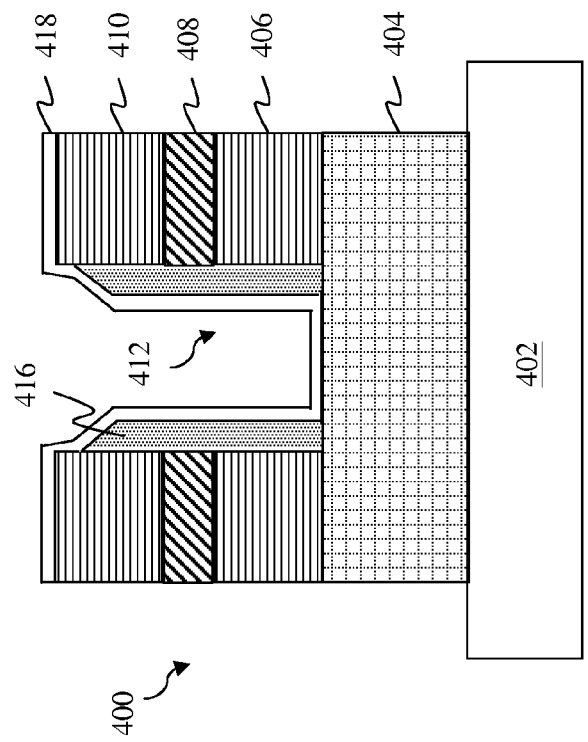
Figure 4E:
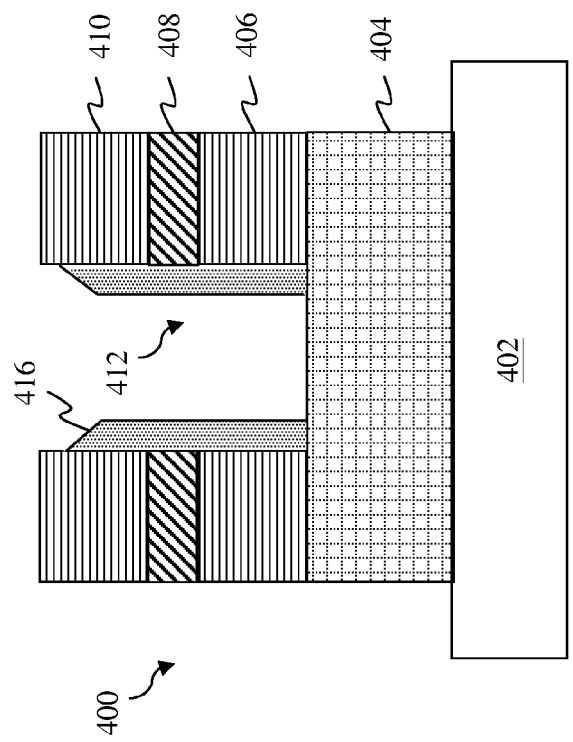

In FIG. 4E, ARD layer 414 is etched to form spacers 416 adjacent the walls of trench 412. ARD layer 414 may be patterned by wet and/or dry etching employing a mask, masking process, and/or photolithographic processes.

In FIG. 4F, a heating layer 418, such as a layer of TiN, may be deposited over the crown feature including silicon oxide layer 410 and trench 412, spacers 416, and BEC 404. The heating layer 418 partially fills the crown feature and has a thickness of about 5 nm to about 25 nm in one example. The heating layer 418 may be formed by atomic layer deposition ("ALD"), CVD, metal-organic CVD ("MOCVD"), PECVD, and/or other suitable techniques.

Figure 4H:
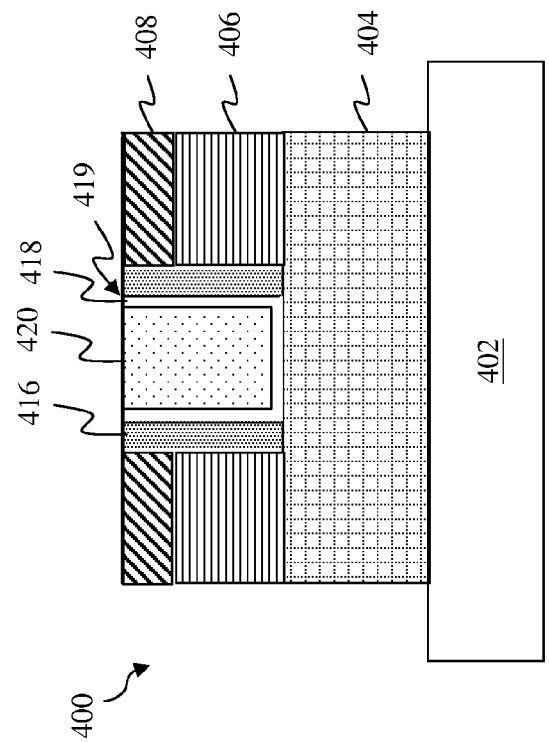
Figure 4G:
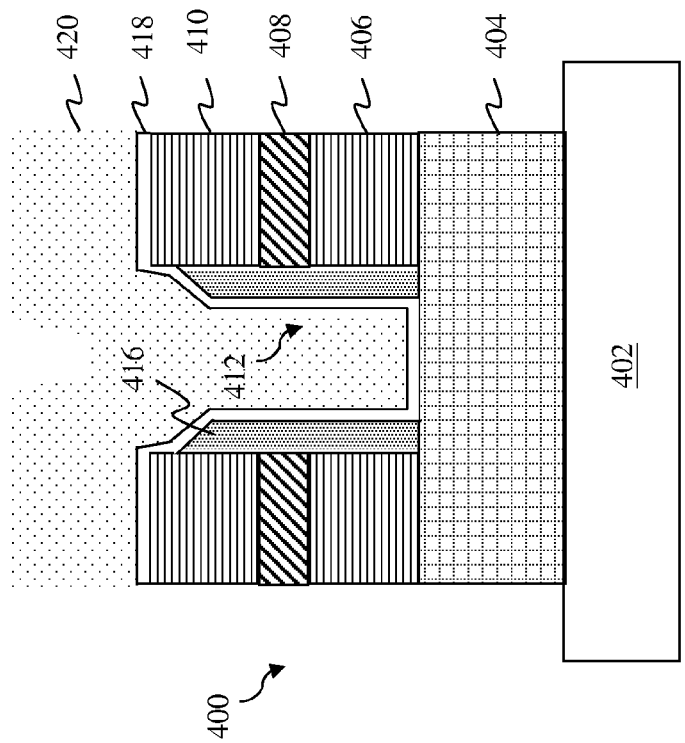

In FIG. 4G, a silicon oxide ("oxide") layer 420 may be deposited over the heating layer 418 to substantially fill in the crown feature including the trench 412. Oxide layer 420 may be deposited by CVD, PECVD, and/or other suitable methods.

In FIG. 4H, a planarization process such as a chemical mechanical planarization (chemical mechanical polishing or "CMP") process may be performed on the oxide layer 420, a portion of the heating layer 418, a portion of spacers 416, and oxide layer 410 to form the planarized heating element 419. The planarizing process may alternatively or collectively include an etch back or other suitable process.

Figure 4I:
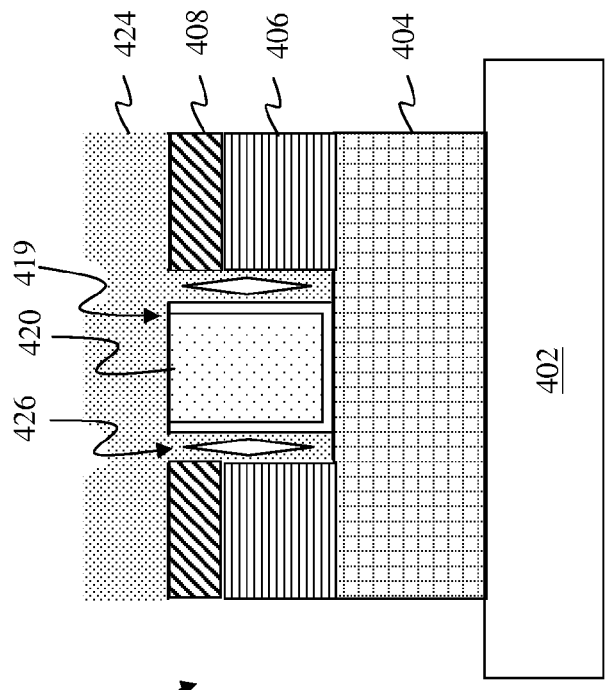

In FIG. 4I, ARD spacers 416 are removed, for example by an ash process, leaving heating element 419 between trenches 422. In one example, the ash process may include an oxygen etch.

Figure 4J:
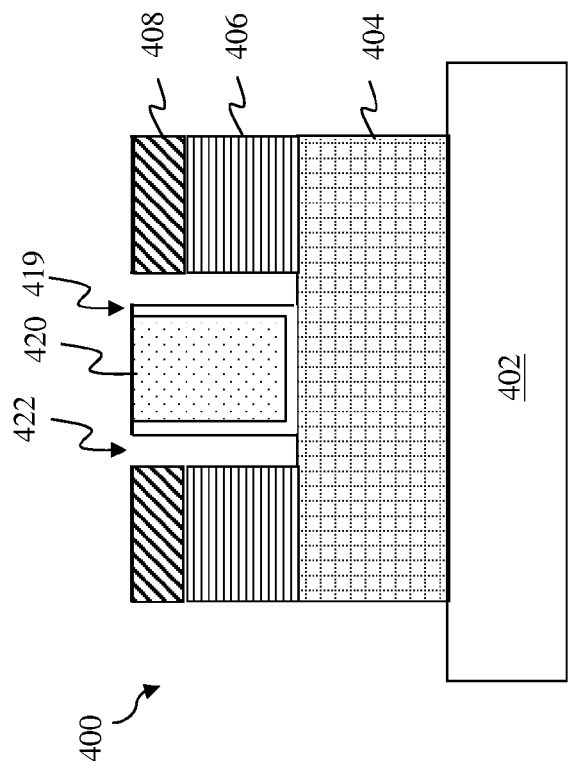

The method 300 continues with block 306 in which an air gap is formed separating a side of the heating element from the dielectric layer. In FIG. 4J, a dielectric layer 424 may be formed over nitride layer 408, the heating element 419, and trenches 422 to form air gaps 426 within trenches 422. In one example, dielectric layer 424 is deposited by high density plasma CVD ("HDP CVD"), but other techniques may be used as suitable to form air gaps within trenches 422. In one example, air gaps 426 each have a height substantially similar to a height of the heating element 419. The dielectric layer 424 may include silicon oxide, silicon-rich nitride, silicon oxy-nitride, and/or other suitable material formed by suitable deposition techniques. Advantageously, the air gaps separate the heating element 419 from surrounding material, such as dielectric layers 406 and 408, and since the air gaps have less conductive properties than the surrounding dielectric materials, heat or energy leakage (loss) from the heating element 419 is reduced.

Figure 4L:
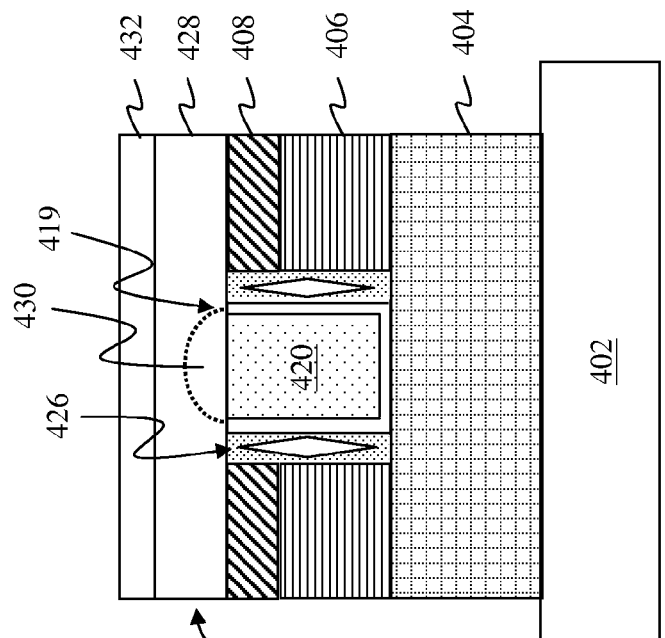
Figure 4K:
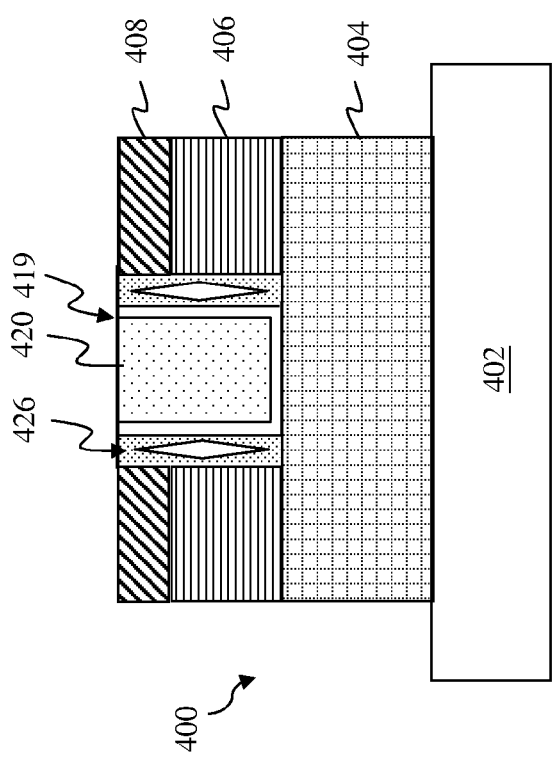

In FIG. 4K, a planarization process such as a chemical mechanical planarization (chemical mechanical polishing or "CMP") process may be performed on the dielectric layer 424 until nitride layer 408 is exposed. The planarizing process may alternatively or collectively include an etch back or other suitable process.

The method 300 continues with block 308 in which a phase change element 427 is formed over the heating element 419. In FIG. 4L, a phase change material layer 428 may be deposited over nitride layer 408, air gaps 426 within dielectric layer 424, and heating element 419. The phase change material layer 428 includes a chalcogenide material or one or more other suitable materials, which exhibit a change in their electrical characteristics (e.g., resistivity) in response to an induced stimulus (e.g., electrical current). In a chalcogenide material, such an exhibition of a change in its electrical characteristics is caused by an associated change in its phase (e.g., from an amorphous phase to a crystalline phase, and vice versa) in response to the induced stimuli. Accordingly, in response to an induced stimulus, the phase change element 427 is capable of performing a conventional memory function (e.g., store a binary state) of the memory device 400.

In the present example, the phase change material layer 428 preferably includes a Ge—Sb—Te ("GST") alloy. Alternatively, other suitable materials for the phase change material layer 428 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

The phase change material layer 428 is configured to be substantially amorphous following back-end-of-line ("BEOL") semiconductor processing. In one example, the phase change material layer 428 may be deposited with a thickness that is less than about 20 nm and a deposition temperature that is less than about 200° C. The phase change material layer 428 may be deposited by a physical vapor deposition ("PVD") (also referred to as "sputtering") process. The specified thickness (e.g., less than about 20 nm) and deposition temperature (e.g., less than about 200° C.) will aid in preventing crystallization and nuclei formation during the deposition process, and thus promote formation of an amorphous background. However, some nuclei formation may exist in the amorphous background but the size of the nuclei may be less than about 3 nm. Further, the interfacial energy dominates as the thickness of the phase change material layer 428 decreases, which results in the amorphous background even with BEOL processing.

Alternatively, the phase change material layer 428 may optionally be formed by sputtering (of GST) and the layer may be doped with silicon (Si) or nitrogen (N) by an ion implantation process. In one example, the concentration of Si or N in the resultant layer may be about 2% to about 25%. The doping of Si or N may increase the crystallization temperature of the phase change material layer 428, and thus may aid in preventing crystallization of the phase change material. Additionally, the Si or N may optionally be added to the phase change material layer 428 (such as GST) by a co-sputtering process or reactive sputtering process using nitrogen as the reactive gas and argon as the inert gas. In another embodiment, the amorphous background may be formed by a pre-amorphization implantation ("PAI") process. PAI involves implanting an species such as silicon (Si) or germanium (Ge) to amorphize the material layer.

In FIG. 4L, the method 300 continues with block 310 in which a top conductive layer 432 is formed over the phase change material layer 428. The top conductive layer 432 may be amorphous and may include a metal nitride (e.g., TiN or TaN), metal silicon nitride, or carbon. The top conductive layer 432 may be formed by ALD, CVD, MOCVD, PECVD, evaporation, and/or other suitable techniques. The top conductive layer 432 may serve as an amorphous capping layer to reduce a seeding effect and prevent nucleating of the phase change material layer 428 from the capping layer. Accordingly, the amorphous top conductive layer 432 may aid in preventing crystallization of the phase change material 428. The phase change material layer 428 and top conductive layer 432 may be patterned to form a phase change memory cell of the memory device 400. Such patterning process includes wet and/or dry etching employing a mask, masking process, and/or photolithographic process.

Although not shown, a top electrode contact ("TEC") may be formed on the top conductive layer 432. The TEC may include copper tungsten, gold, aluminum, carbon nanotubes, carbon fullerenes, refractory metals, and/or other materials, and may be formed by CVD, ALD, PVD, damascene, dual-damascene, and/or other suitable processes. It is understood that further processing may be performed on the memory device 400 such as formation of interconnect metal layers and inter-metal dielectric.

As previously noted, the phase change element 427 of the memory device 400 has an amorphous background. The phase change element 427 further includes an active region 430 (within the amorphous background) that is capable of changing phase between amorphous and crystalline in response to an induced stimulus (such as an electrical current). When the active region 430 is in the amorphous state, the resistivity of the phase change element is relatively high. When the active region 430 is in the crystalline state, the resistivity of the phase change element is relatively low.

Thus, in response to the induced stimulus, the phase change element 427 is capable of performing a conventional memory function (e.g., store a binary state) of the memory device 400. The amorphous background of the phase change element 427 has a lower thermal conductivity than that of a silicon oxide and crystalline background. Accordingly, the amorphous background provides for better thermal isolation of the phase change element 427 thereby reducing a reset current that is required to form the phase of the active region 430 to the amorphous state. It has been observed that the reset current may be reduced by a factor of about 3 when using an amorphous background instead of a crystalline background. It should be noted that the set current (e.g., current required to form the phase of the active region 430 to the crystalline state) is typically lower than the reset current.

Figure 5:
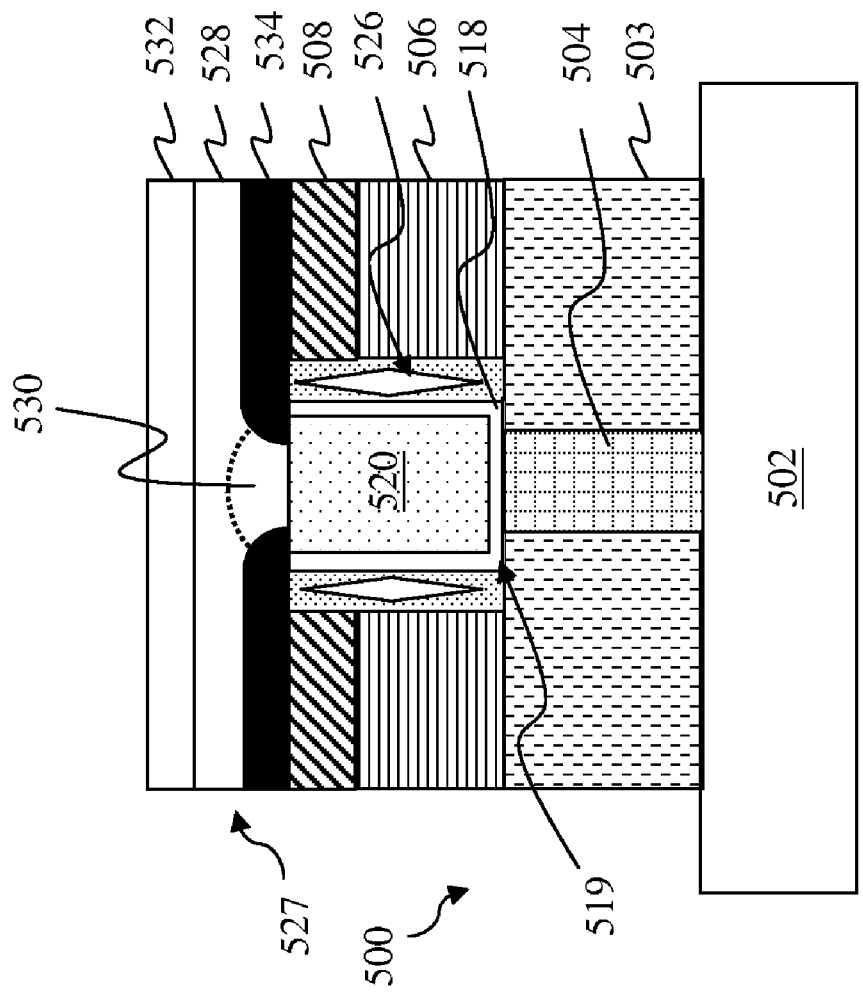
FIG. 5 is a sectional view of an alternative embodiment of a memory device that may be utilized in the memory cell of FIG. 2.

Referring now to FIG. 5, illustrated is an alternative embodiment of a memory device 500 that is representative of the memory device 204 of FIG. 2. It is understood that the memory device 500 may include various semiconductor layers, such as doped layers, insulative layers, epitaxial layers, conductive layers including polysilicon layers, and dielectric layers, but is simplified to illustrate a phase change portion of the memory device for a better understanding of the disclosed embodiments herein. The memory device 500 of FIG. 5 is similar to the memory device 400 of FIG. 4L except for the differences noted below. Similar features in FIGS. 4L and 5 are numbered similarly for the sake of clarity.

Memory device 500 includes a substrate 502 and a bottom electrode contact ("BEC") 504 formed in a dielectric layer 503 such as a silicon oxide layer. The BEC 504 may include a plug formed by patterning and etching a trench in the silicon oxide layer and filling the trench with a conducting material such as tungsten, and then etched back. The plug may include other conducting materials such as copper, aluminum, tantalum, titanium, nickel, cobalt, metal silicide, metal nitride, and polysilicon.

A heating element 519, including a heating layer 518 and a silicon oxide layer 520, is similar to the heating element 419 of FIG. 4L and may be formed by similar processes and techniques. Heating element 519 is formed between air gaps 526 within a dielectric layer comprising a silicon oxide layer 506 and a silicon nitride layer 508.

The phase change element 527 is similar to the phase change element 427 of FIG. 4L except that an insulating portion formed of a dielectric layer 534 is formed over nitride layer 508, air gaps 526, and the heating element 519 by a suitable deposition process. The dielectric layer 534 may include silicon-rich nitride, silicon oxy-nitride, and other suitable material. The dielectric layer 534 may then be patterned and etched to form a trench, which may be centrally positioned over the heating element 519. A phase change material layer 528 may then be deposited over the dielectric layer 534 filling the trench. Similarly, the phase change element 527 of the memory device 500 may have an amorphous background and an active region 530 (within the amorphous background) that is capable of changing phase between amorphous and crystalline in response to an induced stimulus (such as an electrical current).

A top conductive layer 532 is formed over the phase change material layer 528, and although not shown, a top electrode contact ("TEC") may be formed on the top conductive layer 532.

Thus provided are semiconductor devices which include a substrate having a dielectric layer, a heating element formed in the dielectric layer between air gaps, a phase change element formed on the heating element, and a conductive element formed on the phase change element. The phase change element includes a substantially amorphous background and an active region, the active region capable of changing phase between amorphous and crystalline. In some embodiments, the phase change element is of one of a Ge—Sb—Te alloy, Si—Sb—Te alloy, Ga—Sb—Te alloy, As—Sb—Te alloy, Ag—In—Sb—Te alloy, Ge—In—Sb—Te alloy, Ge—Sb alloy, Sb—Te alloy, Si—Sb alloy, and combinations thereof. In other embodiments, the phase change element includes dopants of the type selected from the group consisting of silicon, nitrogen, and combinations thereof.

The present disclosure provides for many different embodiments. One of the broader forms of the present disclosure involves a semiconductor device. The device includes a bottom electrode contact formed on a substrate, and a dielectric layer formed on the bottom electrode contact. The device further includes a heating element formed in the dielectric layer, wherein the heating element is disposed between two air gaps separating the heating element from the dielectric layer, and a phase change element formed on the heating element, wherein the phase change element includes a substantially amorphous background and an active region, the active region capable of changing phase between amorphous and crystalline.

Another of the broader forms of the present disclosure involves another semiconductor device, the device including a substrate, a bottom electrode contact formed on the substrate, a silicon oxide layer formed on the bottom electrode contact, and a silicon nitride layer formed on the silicon oxide layer, and a heating element formed in the silicon oxide layer and the silicon nitride layer. The device further includes two air gaps in silicon oxide, the air gaps separating the heating element from the silicon oxide layer and the silicon nitride layer, wherein each of the two air gaps has a height substantially similar to a height of the heating element, a phase change element formed on the heating element, wherein the phase change element includes a substantially amorphous background and an active region, the active region capable of changing phase between amorphous and crystalline, and a conductive element formed on the phase change element.

Yet another of the broader forms of the present disclosure involves a method of fabricating a semiconductor device. The method includes providing a substrate having a dielectric layer formed thereon, forming a heating element in the dielectric layer, and forming an air gap separating a side of the heating element from the dielectric layer. The method further includes forming a phase change element on the heating element, wherein the phase change element includes a substantially amorphous background and an active region, the active region capable of changing phase between amorphous and crystalline.

Several different advantages exist from these and other embodiments. The phase change memory device and method of the same disclosed herein provide for a phase change element that has an amorphous background for improved thermal isolation of the phase change element. Accordingly, the reset current required to form the amorphous state in the active region of the phase change memory device is reduced. Since the phase change memory cell size is limited by the reset current, the phase change memory device disclosed herein may be used for next generation non-volatile memory devices.

Although only a few embodiments have been described in detail above, those skilled in the art will readily appreciate that many modifications are possible in the embodiments without materially departing from the novel teachings and advantages of this disclosure. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this disclosure.

What is claimed is:

1. A semiconductor device, comprising:
a bottom electrode contact formed on a substrate;
a first dielectric layer formed on the bottom electrode contact;
a heating element formed in the first dielectric layer, wherein the heating element is disposed between two air gaps separating the heating element from the first dielectric layer, wherein the heating element defines a recess and a second dielectric layer is disposed within the recess; and
a phase change element formed on the heating element, wherein the phase change element includes a substantially amorphous background and an active region, the active region capable of changing phase between amorphous and crystalline.

2. The semiconductor device of claim 1, wherein the first dielectric layer is comprised of a silicon nitride layer over a silicon oxide layer.

3. The semiconductor device of claim 1, wherein the heating element is comprised of a layer of titanium nitride.

4. The semiconductor device of claim 1, wherein each of the two air gaps is formed in silicon oxide.

5. The semiconductor device of claim 1, wherein each of the two air gaps has a height substantially similar to a height of the heating element.

6. The semiconductor device of claim 1, wherein the phase change element is of a type selected from the group consisting of Ge—Sb—Te alloy, Si—Sb—Te alloy, Ga—Sb—Te alloy, As—Sb—Te alloy, Ag—In—Sb—Te alloy, Ge—In—Sb—Te alloy, Ge—Sb alloy, Sb—Te alloy, Si—Sb alloy, and combinations thereof.

7. The semiconductor device of claim 1, wherein the phase change element includes dopants of the type selected from the group consisting of silicon, nitrogen, and combinations thereof.

8. The semiconductor device of claim 1, further comprising a conductive element formed on the phase change element, wherein the conductive element is of a type selected from the group consisting of a metal nitride, a metal silicon nitride, and a carbon.

9. A semiconductor device, comprising:
a substrate;
a bottom electrode contact formed on the substrate;
a first silicon oxide layer formed on the bottom electrode contact;
a silicon nitride layer formed on the silicon oxide layer;
a heating element formed in the silicon oxide layer and the silicon nitride layer;
two air gaps in a second silicon oxide layer, the air gaps separating the heating element from the first silicon oxide layer and the silicon nitride layer, wherein each of the two air gaps has a height substantially similar to a height of the heating element, wherein the second silicon oxide layer has a top surface substantially coplanar with a top surface of the silicon nitride layer;
a phase change element formed on the heating element, wherein the phase change element includes a substantially amorphous background and an active region, the active region capable of changing phase between amorphous and crystalline; and
a conductive element formed on the phase change element.

10. The semiconductor device of claim 9, wherein the heating element is comprised of a layer of titanium nitride.

11. The semiconductor device of claim 9, wherein the phase change element is of a type selected from the group consisting of Ge—Sb—Te alloy, Si—Sb—Te alloy, Ga—Sb—Te alloy, As—Sb—Te alloy, Ag—In—Sb—Te alloy, Ge—In—Sb—Te alloy, Ge—Sb alloy, Sb—Te alloy, Si—Sb alloy, and combinations thereof.

12. The semiconductor device of claim 9, wherein the phase change element includes dopants of the type selected from the group consisting of silicon, nitrogen, and combinations thereof.

13. The semiconductor device of claim 9, wherein the conductive element is of a type selected from the group consisting of a metal nitride, a metal silicon nitride, and a carbon.

14. A method of fabricating a semiconductor device, comprising:
providing a substrate having a first dielectric layer formed thereon;
forming a first trench in the first dielectric layer;
forming a heating element in the first trench;
forming a second dielectric layer on the heating element within the first trench;
forming an air gap separating a side of the heating element from the first dielectric layer; and
forming a phase change element on the heating element, wherein the phase change element includes a substantially amorphous background and an active region, the active region capable of changing phase between amorphous and crystalline.

15. The method of claim 14, wherein forming the first dielectric layer includes forming a layer of silicon nitride over a layer of silicon oxide.

16. The method of claim 14, wherein forming the heating element includes depositing a layer of titanium nitride over the first trench.

17. The method of claim 14, wherein forming the air gap includes depositing a silicon oxide layer by high density plasma deposition into a second trench separating the side of the heating element from the first dielectric layer.

18. The method of claim 14, wherein forming the phase change element includes:
depositing an insulating layer over the heating element;
forming a third trench in the insulating layer, the third trench being located directly over the heating element; and
depositing a phase change material layer over the insulating layer and filling in the third trench.

19. The method of claim 14, further comprising forming two air gaps for separating two sides of the heating element from the first dielectric layer, wherein each of the two air gaps has a height substantially similar to a height of the heating element.

20. The method of claim 14, further comprising forming a conductive element on the phase change element.

* * * * *